United States Patent
Yanagisawa et al.

(10) Patent No.: US 10,931,235 B2
(45) Date of Patent: Feb. 23, 2021

(54) SENSING SENSOR

(71) Applicant: NIHON DEMPA KOGYO CO., LTD., Tokyo (JP)

(72) Inventors: Yuki Yanagisawa, Saitama (JP); Hiroyuki Kukita, Saitama (JP); Shohei Nakagawa, Saitama (JP)

(73) Assignee: NIHON DEMPA KOGYO CO., LTD., Tokyo (JP)

( * ) Notice: Subject to any disclaimer, the term of this patent is extended or adjusted under 35 U.S.C. 154(b) by 0 days.

(21) Appl. No.: 16/801,191

(22) Filed: Feb. 26, 2020

(65) Prior Publication Data
US 2020/0274493 A1 Aug. 27, 2020

(30) Foreign Application Priority Data
Feb. 27, 2019 (JP) .............................. JP2019-034299

(51) Int. Cl.
*H03B 5/32* (2006.01)
*G01K 11/26* (2006.01)
*H03B 5/04* (2006.01)

(52) U.S. Cl.
CPC ............. *H03B 5/323* (2013.01); *G01K 11/26* (2013.01); *H03B 5/04* (2013.01); *H03B 2200/007* (2013.01); *H03B 2200/008* (2013.01)

(58) Field of Classification Search
CPC .... H03B 5/323; H03B 5/04; H03B 2200/007; H03B 2200/008; G01K 11/26;
(Continued)

(56) References Cited

U.S. PATENT DOCUMENTS

| 6,196,059 B1 | 3/2001 | Kosslinger et al. |
| 9,086,338 B2 | 7/2015 | Shinobu et al. |
| 2019/0265177 A1* | 8/2019 | Kukita ..................... G01N 5/04 |

FOREIGN PATENT DOCUMENTS

| JP | 2012220454 | 11/2012 |
| JP | 2018080947 | 5/2018 |

OTHER PUBLICATIONS

Author: Wood et al.; Title: MSX Satellite Flight Measurements of Contaminant Deposition on a CQCM and on TQCMs; Date: Jan. 6-10, 1997; Publisher: 35th Aerospace Sciences Meeting and Exhibit; Pertinent p. 1-10 (Year: 1997).*

(Continued)

*Primary Examiner* — Richard Tan
(74) *Attorney, Agent, or Firm* — JCIPRNET

(57) ABSTRACT

A sensing sensor includes an oscillator circuit, a base, a connection portion, and a temperature changing unit. The oscillator circuit oscillates the piezoelectric resonator. The base includes a base main body in which a depressed portion is provided and a lid portion at one side, supports the piezoelectric resonator at another side, and is for taking the oscillation frequency to an outside of the sensing sensor. The depressed portion houses the oscillator circuit. The lid portion covers the depressed portion. The connection portion is disposed at the one side of the base and connected to a cooling mechanism for cooling the base from the one side. The temperature changing unit is interposed between the piezoelectric resonator and the base, so as to cool and heat the piezoelectric resonator and transfer a heat radiated for cooling the piezoelectric resonator from the other side of the base to the one side.

6 Claims, 7 Drawing Sheets

(58) Field of Classification Search
CPC ... G01N 2291/0426; G01N 2291/0255; G01N 2291/021; G01N 29/326; G01N 29/036; G01N 29/222; G01N 29/022
USPC .......................................................... 331/158
See application file for complete search history.

(56) References Cited

OTHER PUBLICATIONS

"Search Report of Europe Counterpart Application", dated Jul. 17, 2020, p. 1-p. 7.

\* cited by examiner

SENSING SENSOR

CROSS-REFERENCE TO RELATED APPLICATIONS

This application claims the priority benefit of Japanese Patent Application No. 2019-034299, filed on Feb. 27, 2019. The entirety of the above-mentioned patent application is hereby incorporated by reference herein and made a part of this specification.

TECHNICAL FIELD

The disclosure relates to a sensing sensor that senses a substance to be sensed by a frequency variation of a piezoelectric resonator.

DESCRIPTION OF THE RELATED ART

As a sensing device that employs a sensing sensor for sensing substances included in a gas, a Quartz crystal microbalance (QCM) using a crystal unit has been known. As a QCM like this, a technique that attaches the gas to the crystal unit that constitutes the above-described sensing sensor, and then gradually increases a temperature of the crystal unit that has been cooled and made a relatively low temperature so as to detach the gas attached to the crystal unit has been known. According to this technique, an amount of the attached gas is measured by measuring an amount of a frequency variation before and after the detachment of this gas, and components of the gas are identified by detecting the temperature at which the gas is detached. As the sensing sensor that actively executes a temperature control of the above-described crystal unit, the sensing sensor where a Peltier element is built-in has been known, and the QCM using such a sensing sensor is known as a Thermoelectric QCM (TQCM).

In order to detect more various substances with the sensing sensor for such a TQCM, a lower limit of the temperature of the crystal unit is required to be lowered more to expand a changeable temperature range of the crystal unit. Meanwhile, the crystal unit is required to be stably oscillated, that is, to have an increased oscillation margin.

Note that, Japanese Unexamined Patent Application Publication No. 2018-80947 shows a sensing sensor for conducting the QCM. This sensing sensor includes an oscillator circuit module, a quartz substrate as a crystal unit that is supported by the oscillator circuit module so as to separate from and opposed to the oscillator circuit module, and a heater disposed on the quartz substrate. However, this sensing sensor conducts a QCM referred to as a Cryogenic QCM (CQCM). The quartz substrate is cooled by supplying a peripheral area of a container enclosing the sensing sensor with liquid nitrogen, and the sensing sensor itself is not configured to be able to cool the crystal unit.

A need thus exists for a sensing sensor which is not susceptible to the drawback mentioned above.

SUMMARY

According to an aspect of this disclosure, there is provided a sensing sensor that senses a substance to be sensed based on a change of an oscillation frequency of a piezoelectric resonator, in which the substance to be sensed which is a gas is attached to the piezoelectric resonator, and the substance to be sensed is detached by changing a temperature of the piezoelectric resonator. The sensing sensor includes an oscillator circuit, a base, a connection portion, and a temperature changing unit. The oscillator circuit is configured to oscillate the piezoelectric resonator. The base includes a base main body and a lid portion at one side of the base, in which the base main body is provided with a depressed portion for housing the oscillator circuit, and the lid portion is for covering the depressed portion. The base is configured to support the piezoelectric resonator at another side of the base and take the oscillation frequency to an outside of the sensing sensor. The connection portion is disposed at the one side of the base and connected to a cooling mechanism for cooling the base from the one side of the base. The temperature changing unit is interposed between the piezoelectric resonator and the base, so as to cool and heat the piezoelectric resonator and transfer a heat radiated for cooling the piezoelectric resonator from the other side of the base to the one side of the base.

BRIEF DESCRIPTION OF THE DRAWINGS

The foregoing and additional features and characteristics of this disclosure will become more apparent from the following detailed description considered with reference to the accompanying drawings.

DESCRIPTION OF EMBODIMENTS

Figure 1:
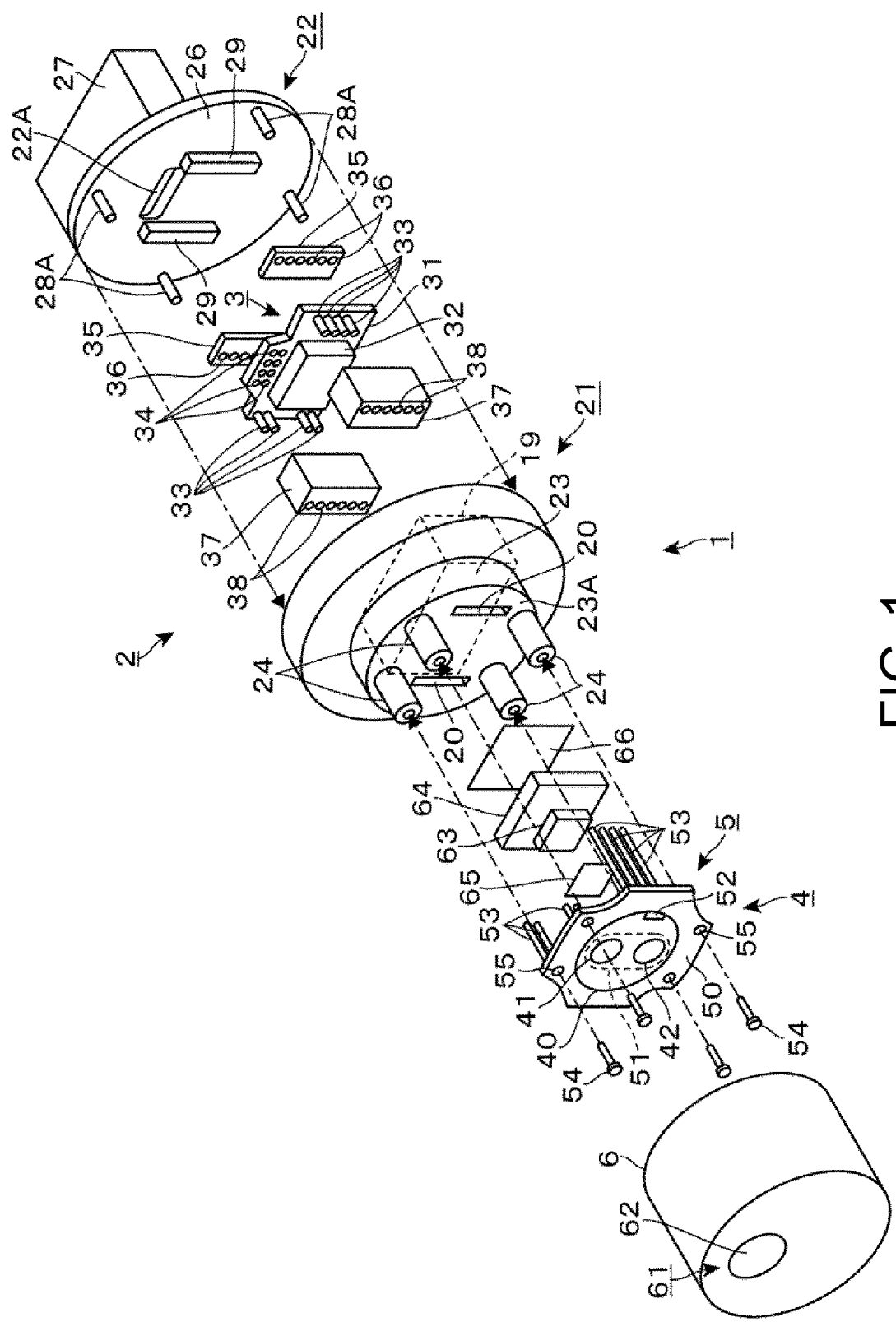
FIG. 1 is an exploded perspective view of a sensing sensor according to an embodiment disclosed here.

A sensing sensor 1 used for a TQCM as one embodiment disclosed here will be described with reference to an exploded perspective view of FIG. 1 and a longitudinal sectional side view of FIG. 2. The sensing sensor 1 includes a base 2, a circuit board 3, a Peltier element 63 as a first Peltier element, a Peltier element 64 as a second Peltier element, a sensor unit 5 including a crystal unit 4, and a cover 6. According to an outline of a structure of the sensing sensor 1, the Peltier elements 63 and 64, the sensor unit 5, and the cover 6 are each supported by the base 2, and the Peltier elements 63 and 64 and the sensor unit 5 on the base 2 are covered with the cover 6. The cover 6 opens and is configured to allow for supplying the crystal unit 4 with a gas. The circuit board 3 to oscillate the crystal unit 4 is housed inside the base 2. This sensing sensor 1 is configured to be able to change a temperature of the crystal unit 4, for example, in a range from −80° C. to 125° C., with the Peltier elements 63 and 64. The base 2 is configured to take an oscillation frequency of the crystal unit 4 out to an external device of the sensing sensor 1 and to be able to connect to a cooling mechanism to exhaust heat generated when the Peltier elements 63 and 64 cool the crystal unit 4.

Figure 2:
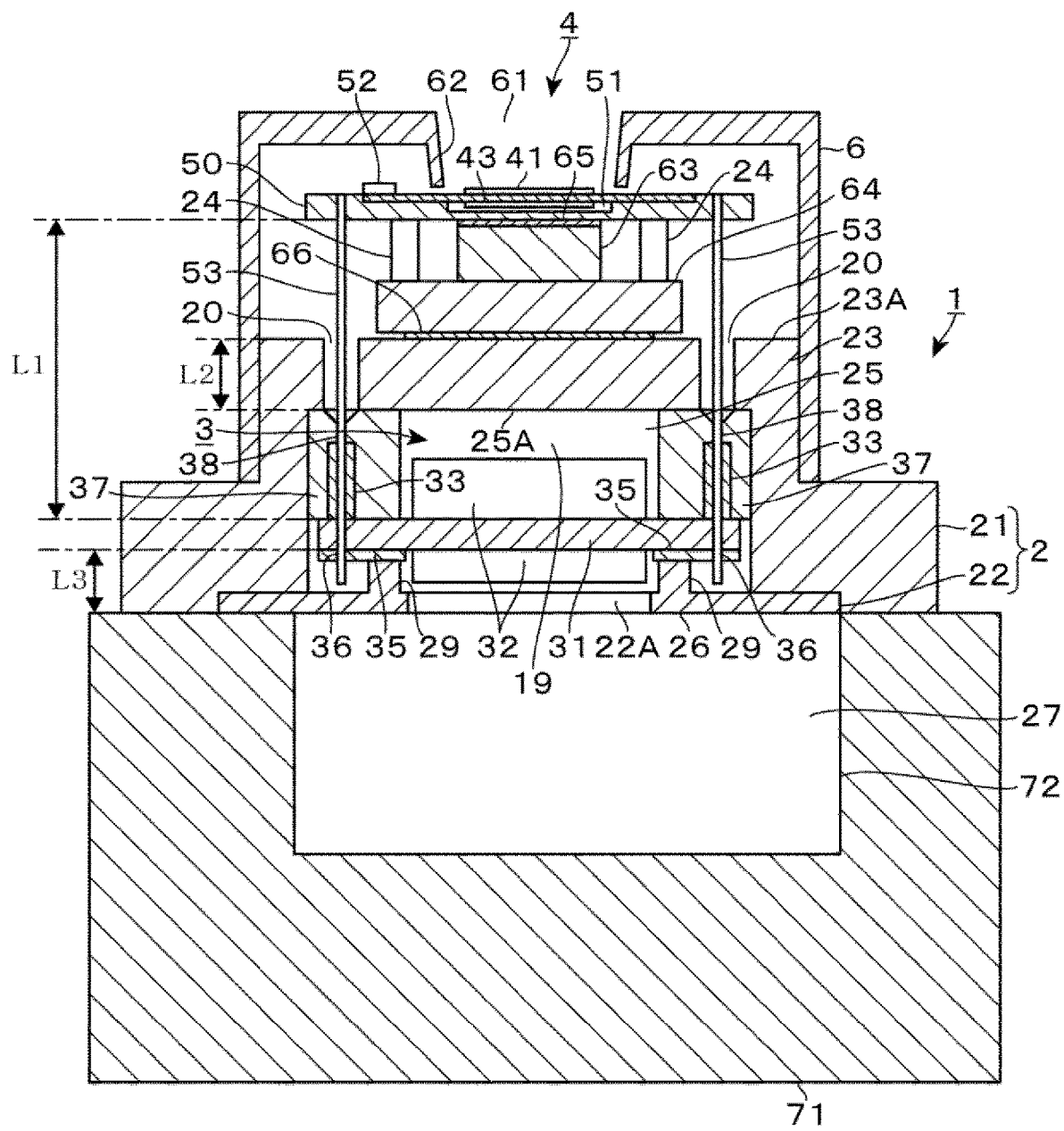
FIG. 2 is a longitudinal sectional side view of the sensing sensor.
Figure 3:
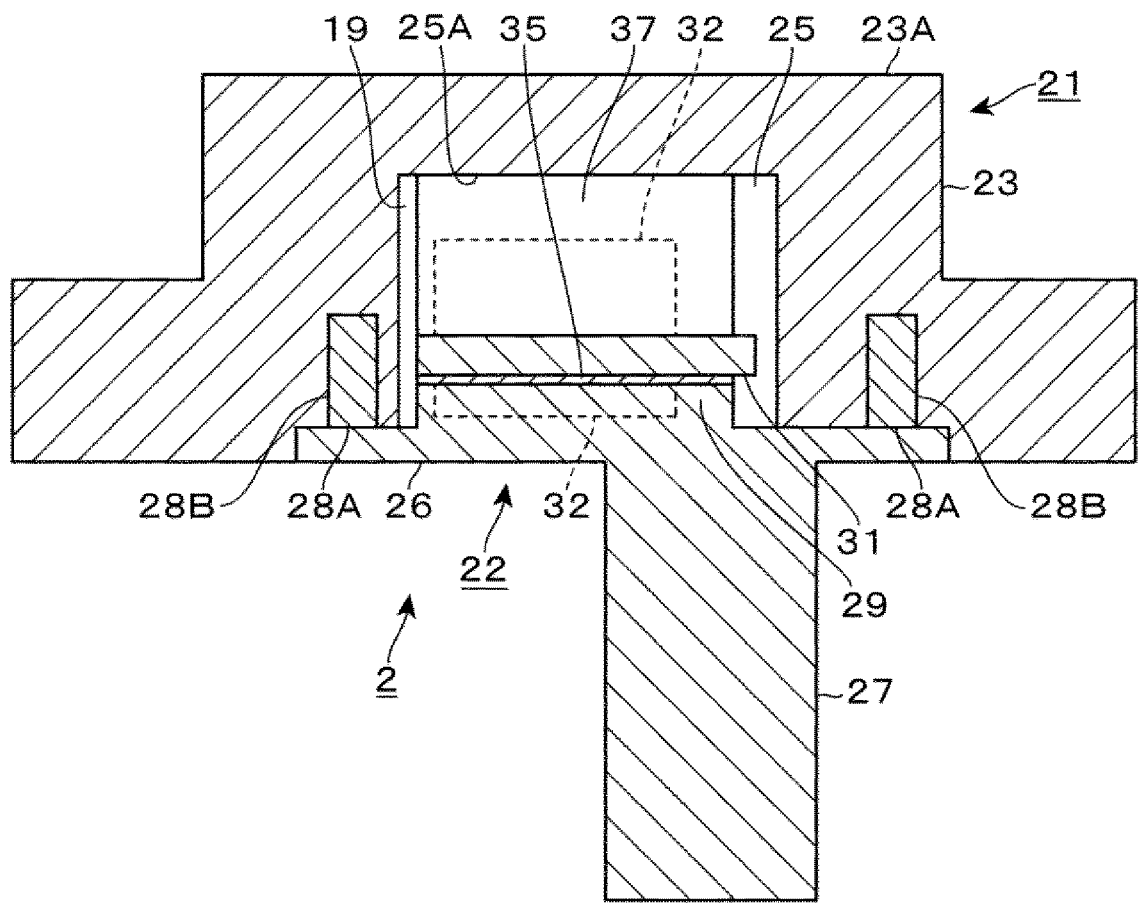
FIG. 3 is a longitudinal sectional side view of a base that constitutes the sensing sensor.

FIG. 3 is a longitudinal sectional side view of the base 2, and illustrates the base 2 oriented in a different direction around a central axis of the base 2 by 90° from that in FIG. 2. First, the base 2 will be described with reference to FIG. 1 to FIG. 3. The base 2 is configured of, for example, a nickel-plated copper, and includes a base main body 21 and a lid portion 22.

The base main body 21 is configured as a block in a circular shape in a planar view, and is, for example, integrally molded to achieve high heat transfer property. The base main body 21 has a center of one surface side (top surface side) protruding to the one surface side to be configured as a protrusion portion 23 in the circular shape in the planar view. The protrusion portion 23 has one surface configured as a flat surface 23A. From a peripheral edge portion of this flat surface 23A toward the one surface side, four cylinder portions 24 project, and the cylinder portions 24 are disposed along a circumferential direction of the flat surface 23A at intervals. This flat surface 23A has two elongated holes 20 separately arranged on a right and left in the planar view, and each opens in a manner extending perpendicular to the right and left. The base main body 21 has a depressed portion 19 forming in a center of another surface side, and the above-described elongated holes 20 open inside the depressed portion 19. Unless otherwise described in the following description, a protrusion direction of the protrusion portion 23 is an upper direction, an arranging direction of the two elongated holes 20 is a lateral direction, and a direction in which the elongated holes 20 are formed is a longitudinal direction. However, these directions are provided for convenience of an explanation, and the directions of the sensing sensor 1 when used are not limited to the directions indicated here.

The lid portion 22 that constitutes the base 2 includes a plate-shaped body 26 in a circular shape and a rectangular-shaped connector 27. The plate-shaped body 26 forms a sealed housing space 25 that covers the above-described depressed portion 19 from a lower side (one side) of the base main body 21 and houses the above-described circuit board 3 and the like. The connector 27 projects downward of the plate-shaped body 26. Note that, a ceiling surface of the housing space 25 is indicated as 25A in the drawings. The plate-shaped body 26 has an upper side with a peripheral edge portion on which protrusions 28A are disposed along a periphery of the plate-shaped body 26 at intervals (see FIG. 1 and FIG. 3). The protrusions 28A are inserted into holes 28B provided on the lower side of the base main body 21 to fit with the holes 28B. Accordingly, the base main body 21 and the lid portion 22 are fixed to one another. Additionally, respective positions apart at a right and left on an upper surface side of the plate-shaped body 26 bulge, and are formed as longitudinally elongated and flat support protrusions 29. Additionally, a depressed portion 22A is formed at a position overlapping the connector 27 on the upper surface side of the plate-shaped body 26 (see FIG. 1 and FIG. 2).

Next, the circuit board 3 will be described. The circuit board 3 includes a substrate (substrate main body) 31, and respective integrated circuits 32 disposed at a center of an upper surface side of the substrate 31 and at a center of a lower surface side. The integrated circuit 32 is configured by a semiconductor element made of silicon. Although details will be described later, the integrated circuit 32 includes an oscillator circuit that is connected to the crystal unit 4 and oscillates the crystal unit 4, a regulator, a switch, and the like. At respective end portions on a right and left on an upper surface side of the substrate 31, a plurality of tubular sockets 33 extending in a vertical direction are formed side by side in the longitudinal direction. The sockets 33 are conductive and electrically connected to the respective integrated circuits 32. Additionally, positions of the respective sockets 33 correspond to positions of pins 53, described below, inserted into the sockets 33. On the substrate 31, holes are bored in a thickness direction so as to overlap holes of these sockets 33, and the pins 53 inserted into the sockets 33 are configured to be able to penetrate the substrate 31. Additionally, the substrate 31 is provided with connection portions 34 to which one end of a cable (not illustrated) connects (see FIG. 1). The other end of the cable is extracted to the depressed portion 22A of the plate-shaped body 26 of the above-described base 2, and connected to the connector 27. That is, the circuit board 3 and the connector 27 are electrically connected.

Incidentally, the housing space 25 houses two spacers 35 and two guiding members 37 besides the circuit board 3. These spacers 35 and guiding members 37 are heat insulating portions that suppresses heat transfer from the base 2 to the circuit board 3, and are configured by a material with a low heat conductivity, such as Teflon (registered trademark). The spacers 35 are located underneath respective end portions on a right and left of the substrate 31 of the circuit board 3, and the guiding members 37 are located above the respective end portions on the right and left of the substrate 31.

The spacer 35 has a plate shape, and has one of right and left edge portions supported on the support protrusion 29 of the above-described base 2. The spacer 35 has the other of the right and left edge portions arranged so as to project outside of the support protrusion 29 and to a peripheral edge portion side of the base 2. On this other of the right and left edge portions, a plurality of holes 36 that penetrate the spacers 35 in a thickness direction are formed, and the holes 36 are arranged in a longitudinal direction. These holes 36 overlap the holes of the sockets 33 of the circuit board 3 described above, and are provided such that the pins 53 are inserted.

The guiding member 37 includes a plurality of through holes 38 that vertically penetrate the guiding member 37, and the through holes 38 are arranged in the longitudinal direction. The through holes 38 have lower portion sides where the above-described sockets 33 are inserted. The through holes 38 also have upper portion sides having structures in which diameters expand as approaching upper ends such that the pins 53 are guided into the sockets 33 when the pins 53 are inserted into the sockets 33.

As described above, the base main body 21 of the base 2 and the lid portion 22 are fixed to one another. Thus, upper surfaces and lower surfaces of the guiding members 37 are respectively brought into close contact with the ceiling surface 25A of the housing space 25 and an upper surface of the substrate 31, and the right and left end portions of the substrate 31 are sandwiched by the guiding members 37 and the spacers 35 such that upper surfaces and lower surfaces of the spacers 35 are respectively brought into close contact with a lower surface of the substrate 31 and the support protrusions 29. Accordingly, respective positions of the guiding members 37, the spacers 35, and the substrate 31 are fixed in the housing space 25. Thus, when the respective members are fixed, the integrated circuit 32 on the upper surface side of the substrate 31 becomes separate from the ceiling surface 25A of the housing space 25, and the integrated circuit 32 on the lower surface side of the substrate 31 becomes separate from the plate-shaped body 26 of the base 2. That is, a height of the guiding members 37 is greater than a height of the integrated circuit 32 on the upper surface side of the substrate 31, and a sum of a height of the support protrusions 29 and a height of the spacers 35 is greater than a height of the integrated circuit 32 on the lower surface side of the substrate 31. Additionally, side surfaces of the substrate 31 are separate from sidewalls forming the housing space 25.

Figure 4:
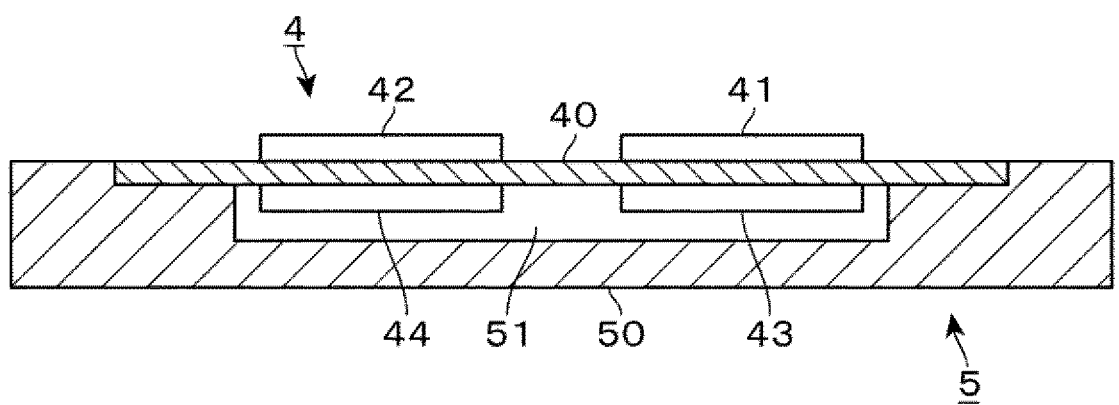
FIG. 4 is a schematic, longitudinal sectional side view of a crystal unit that constitutes the sensing sensor.

Next, a configuration of the sensor unit 5 will be described. First, the crystal unit 4 as a piezoelectric resonator that constitutes the sensor unit 5 will be described using FIG. 4 as a schematic, longitudinal sectional side view of the crystal unit 4. This crystal unit 4 includes a circular plate-shaped crystal element 40 that is, for example, an AT-cut piezoelectric piece. The crystal element 40 has an upper surface side where excitation electrodes 41 and 42 are separately disposed. The crystal element 40 has a lower surface side where excitation electrodes 43 and 44 are longitudinally and separately disposed. The excitation electrodes 41 to 44 are configured of, for example, gold (Au), and is formed in circular shapes.

The excitation electrodes 41 and 43 are paired, and overlap one another sandwiching the crystal element 40. These excitation electrodes 41 and 43 are defined as first excitation electrodes. The excitation electrodes 42 and 44 are paired, and overlap one another sandwiching the crystal element 40. These excitation electrodes 42 and 44 are defined as second excitation electrodes. For the first excitation electrode 41 and the second excitation electrode 42 on one surface side of the crystal element 40, the first excitation electrode 41 is a reaction electrode to which the gas is attached, and the second excitation electrode 42 is a reference electrode to which the gas is not attached. The peripheries of the excitation electrodes 41 to 44 are partially extracted to an edge portion of the crystal element 40, and form extraction electrodes (not illustrated).

Additionally, the sensor unit 5 includes a substrate 50 that holds the above-described crystal unit 4 in its center. The substrate 50 has an upper surface where a mostly elliptical depressed portion 51 is formed. The depressed portion 51 houses the first excitation electrode 43 and the second excitation electrode 44 on the lower surface side of the crystal unit 4. The crystal unit 4 has a peripheral edge portion supported by an opening edge portion of the depressed portion 51. Additionally, on the upper surface of this substrate 50, a temperature detector 52 that detects a temperature of the crystal unit 4 is disposed (see FIG. 1 and FIG. 2).

This temperature detector 52 and extraction electrodes extended from the above-described respective excitation electrodes 41 to 44 are electrically connected to upper end portions of the elongated, rod-shaped pins 53 with a small diameter via conductive members, such as wiring patterns (not illustrated) formed on the substrate 50 and conductive clips (not illustrated) disposed on the substrate 50. These pins 53 are conductive members, and this plurality of the pins 53 are disposed on each of right and left end portions of the substrate 50 and are arranged in the longitudinal direction. The pins 53 penetrate the substrate 50 and extend long downward in a vertical direction of the substrate 50. Then, the pins 53 are inserted through the elongated holes 20 of the base 2, the through holes 38 of the guiding members 37, the holes of the sockets 33, the holes of the substrate 31, and the holes 36 of the spacers 35 in this order, and the lower ends of the pins 53 are positioned at side portions of the support protrusions 29. Thus, inserting the pins 53 into the holes of the respective members ensures fixing mutual positions in the longitudinal direction and mutual positions in the lateral direction of the sensor unit 5, the guiding members 37, the circuit board 3, and the spacer 35.

Additionally, inserting the pins 53 into the sockets 33 ensures electrically connecting the pins 53 to the sockets 33, and electrically connecting the crystal unit 4 and the temperature detector 52 of the sensor unit 5 to the circuit board 3. As described above, since the circuit board 3 and the connector 27 of the base 2 are electrically connected to one another, the crystal unit 4 and temperature detector 52, the circuit board 3, and the connector 27 are electrically connected to one another. Thus, the substrate 50 where the pins 53 are inserted is supported by the cylinder portions 24 of the above-described base 2, and a lower surface of the substrate 50 is opposed to the flat surface 23A of the base 2. In FIG. 1, reference sign 54 denotes a screw, and are inserted into through holes 55 formed in the substrate 50 and holes of the cylinder portions 24 from the upper side to fix the substrate 50 on the base 2.

Incidentally, the circuit board 3 is disposed in the base 2 to shorten a distance between the crystal unit 4 and the oscillator circuit. Shortening the distance in this way increases negative resistance of the oscillator circuit. Accordingly, an oscillation margin of the crystal unit 4 increases, and the crystal unit 4 is stably oscillated to ensure enhancing detection accuracy of a substance to be sensed. Additionally, shortening the distance between the crystal unit 4 and the oscillator circuit in this way reduces parasitic capacitance between the oscillator circuit and the crystal unit 4. Consequently, mass change in the crystal unit 4 and change in the oscillation frequency correspond with high accuracy. Thus, for example, when change with time in the oscillation frequency is expressed in a graph, a waveform of the graph becomes sharp. That is, the substance to be sensed can be detected with high accuracy also from a standpoint of reducing this parasitic capacitance. In order to obtain these effects, for the above-described pins 53, a length L1 between the sensor unit 5 and the substrate 31 of the circuit board 3 is set to be, for example, from 12.8 mm to 13.8 mm. Note that, the circuit board 3 and the sensor unit 5 are connected by the pins 53 with the small diameter as described above with an aim to suppress the heat transfer between the circuit board 3 and the sensor unit 5.

Next, the cover 6 will be described. This cover 6 is configured such that the gas is introduced into the first excitation electrode 41 on the upper surface side of the above-described crystal unit 4. To specifically describe the configuration, this cover 6 is configured as a standing cylinder with a ceiling, and the cover 6 has a lower end portion surrounding a side peripheral surface of the protrusion portion 23 of the base 2 and is engaged with the base 2. Then, at the ceiling of the cover 6, a circular opening 61 opens so as to overlap the previously-described first excitation electrode 41. An opening edge of the opening 61 extends downward and forms a tubular guide 62 that gradually decreases in opening diameter as heading downward. The guide 62 has a lower end separate slightly, for example by 0.5 mm, from the surface of the crystal unit 4.

Additionally, a heat conduction sheet 65, the Peltier element 63, the Peltier element 64, and a heat conduction sheet 66 are laminated in this order from an upper side (other side) toward a lower side (one side) between the lower surface of the substrate 50 of the above-described sensor unit 5 and the flat surface 23A of the base 2. Therefore, these Peltier elements 63 and 64 and the heat conduction sheets 65 and 66 are received while being interposed between the crystal unit 4 and the base 2. The Peltier elements 63 and 64 as temperature changing units that change a temperature of the sensor unit 5 are each formed in a square shape, and a lower surface of the Peltier element 63 and an upper surface of the Peltier element 64 are brought into close contact with one another. Additionally, the heat conduction sheet 65 is brought into close contact with each of the lower surface of the substrate 50 and an upper surface of the Peltier element 63, and the heat conduction sheet 66 is brought into close contact with each of the flat surface 23A and a lower surface of the Peltier element 64. The heat conduction sheets 65 and 66 are configured of a material with a relatively high thermal conductance, such as a graphite sheet.

For the Peltier elements 63 and 64, temperatures of their upper surfaces and temperatures of their lower surfaces are each changed. That is, the surfaces on one side of the upper surfaces and the lower surfaces of the Peltier elements 63 and 64 are heat radiation surfaces (heating surfaces), and the surfaces on the other side are cooling surfaces. The heat radiation surfaces and the cooling surfaces are switched to one another by switching a direction of current supplied to the Peltier elements 63 and 64 to enable cooling and heating the sensor unit 5. When the sensor unit 5 is cooled, the upper surfaces of both the Peltier elements 63 and 64 become the cooling surfaces and the lower surfaces become the heat radiation surfaces. When the sensor unit 5 is heated, the upper surfaces of both the Peltier elements 63 and 64 become the heat radiation surfaces and the lower surfaces become the cooling surfaces. Additionally, the upper surface of the Peltier element 64 on a lower stage side is formed larger than the lower surface of the Peltier element 63 on an upper stage side, and at a center of the upper surface of the Peltier element 64, the lower surface of the Peltier element 63 is disposed. Such a configuration is applied to efficiently cool the heat radiation surface of the Peltier element 63 when the sensor unit 5 is cooled as described above. Note that, the Peltier elements 63 and 64 are indicated as separate components, but for example, an integrated component is used in two stages in this manner.

Here, the connector 27 of the above-described base 2 will be supplementally described. The connector 27 is a connection portion that is inserted into a depressed portion 72 provided on a cooling mechanism 71 for cooling the sensing sensor 1 to be connected to the cooling mechanism 71 (see FIG. 2). This insertion causes an electrode (not illustrated) disposed on the connector 27 and an electrode (not illustrated) disposed in the depressed portion 72 to be connected to one another. The electrode disposed in the depressed portion 72 of this cooling mechanism 71 is connected to a device main body 8 as an external device that controls an operation of the sensing sensor 1. That is, insertion of the connector 27 into the depressed portion 72 allows the sensing sensor 1 to be electrically connected to the device main body 8 and to be cooled with the cooling mechanism 71. The sensing sensor 1, the cooling mechanism 71, and the device main body 8 constitute a sensing device.

The cooling mechanism 71 is configured by a chiller that, for example, includes a flow passage in which a coolant circulates, and is configured such that the depressed portion 72 and an opening edge portion of the depressed portion 72 can be cooled. Accordingly, the connector 27 in a state being inserted into the depressed portion 72 and a lower surface of the base 2 are cooled with the cooling mechanism 71. Note that, since the base 2 is cooled with the connector 27 as a protrusion constituting the base 2 inserted into the depressed portion 72 in this way, a contacted area of the cooling mechanism 71 and the base 2 becomes relatively large. Therefore, the base 2 is efficiently cooled, and eventually, the crystal unit 4 can be efficiently cooled as described below.

Incidentally, the base 2 is cooled from the lower side in this way. Additionally, as described above, when the sensor unit 5 is cooled, the lower surfaces of the Peltier elements 63 and 64 become the heat radiation surfaces to radiate heat to an upper portion of the base 2. In order to remove heat of the Peltier elements 63 and 64 generated when this sensor unit 5 is cooled by efficiently transferring the heat to the lower side where cooling is performed and allow for cooling the crystal unit 4 to a lower temperature, the base 2 is configured to house the circuit board 3 by forming the depressed portion 19 on the lower side of the base main body 21 as described above.

To describe an effect of this configuration of the base 2 in more detail, a description will be given using a comparative example of a base. The base of this comparative example is configured such that the base main body 21 has a depressed portion formed on an upper side instead of a depressed portion formed on a lower side, and the housing space 25 that houses the circuit board 3 by covering this depressed portion with a lid is formed. The Peltier elements 63 and 64 are disposed on the lid. Since a space where the cylinder portions 24 that support the above-described pins 53 and the sensor unit 5 are disposed needs to be secured on the base, a shape of the lid of the base according to this comparative example is constrained. That is, the lid is supposed to be formed so as not to interfere with the pins 53 and the cylinder portions 24, and this makes it difficult to secure a sufficient contact area of an edge portion of the lid and an opening edge portion of the depressed portion of the base main body 21. In a case where such a configuration is applied, the heat emitted from the Peltier elements 63 and 64 cannot be possibly transferred sufficiently to the lower side of the base main body 21 via the lid. Additionally, when a thickness of the lid is small, a thermal capacity of the lid is small. This further decreases a heat transfer property to the lower side of the base main body 21. Therefore, with the configuration of the base of the comparative example, the heat radiation from the Peltier elements 63 and 64 becomes insufficient, and the temperature of the crystal unit 4 cannot be possibly reduced sufficiently.

However, as described above, the base 2 is configured to form the depressed portion 19 on the lower side of the base main body 21 to have the circuit board 3 inserted from the lower side, and cover the depressed portion 19 to form the housing space 25. This increases a thickness of an upper portion between the Peltier elements 63 and 64 and the housing space 25 in the base main body 21 so as to increase a thermal capacity, and the heat is easily absorbed in this thick upper portion. Then, forming the depressed portion 19 from the lower side also increases a thermal capacity between this thick upper portion and sidewalls of the depressed portion 19, and the heat transfer from the thick upper portion to the sidewalls of the depressed portion 19 is easily performed. That is, viewing from the Peltier elements 63 and 64, a thermal resistance of the base 2 is small, and the heat is efficiently transferred to the lower side of the base 2 where cooling is performed. This ensures obtaining high heat radiation performance, and accordingly, making the temperature of the crystal unit 4 to have a lower temperature as described above. Note that, in order to obtain such high heat radiation performance, a distance L2 (see FIG. 2) between the flat surface 23A of the base main body 21 supporting the Peltier elements 63 and 64 and the ceiling surface 25A of the housing space 25 of the circuit board 3 is, for example, from 4.8 mm to 5.8 mm.

Furthermore, the configuration in which the depressed portion 19 is formed on the lower side of the base main body 21 and has the circuit board 3 inserted from the lower side in this way causes the circuit board 3 to position relatively close to the cooling mechanism 71 when the sensing sensor 1 is used. Therefore, temperature rise of the oscillator circuit is suppressed. Once the temperature rise of the oscillator circuit is suppressed in that way, a decrease in the negative resistance of the oscillator circuit can be suppressed, and the oscillation margin of the crystal unit 4 can be increased more. In order to obtain such an effect, for example, a distance L3 between a lower surface of the circuit board 3 and a lower surface of the lid portion 22 of the base 2 is, for example, from 2.8 mm to 3.8 mm.

Figure 5:
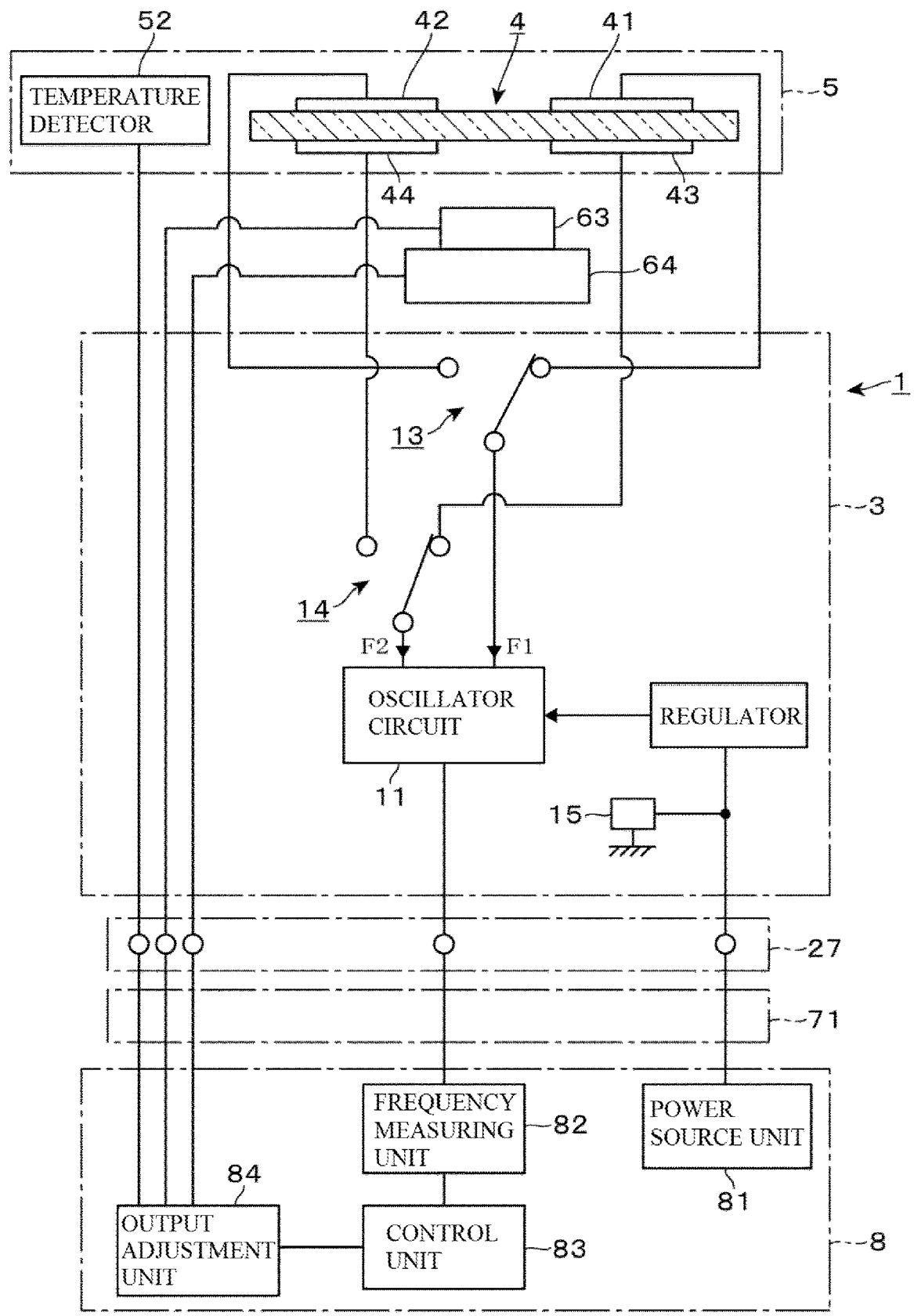
FIG. 5 is a block diagram of a sensing device including the sensing sensor.

Next, the overall configuration of the above-described sensing device will be described with reference to FIG. 5. In the drawing, reference sign 11 denotes an oscillator circuit. In the drawing, reference sign 12 denotes a regulator 12 to regulate voltage supplied to an oscillator circuit 11. As previously described, these oscillator circuit 11 and the regulator 12 are disposed on the integrated circuits 32 of the circuit board 3. As described above, the sensor unit 5 and the circuit board 3 are electrically connected via the pins 53. Accordingly, the first excitation electrode 41 and the second excitation electrode 42 on the upper surface side of the crystal unit 4 are connected to the oscillator circuit 11 via a switch 13 disposed on the integrated circuit 32, and the first excitation electrode 43 and the second excitation electrode 44 on the lower surface side of the crystal unit 4 are connected to the oscillator circuit 11 via a switch 14 disposed on the integrated circuit 32. Note that, in the drawing, reference sign 15 denotes a heater resistor, and has a role to generate heat by an electric power supplied from the device main body 8 and adjust the temperature of the circuit board 3 such that a semiconductor element constituting the circuit board 3 can work in the temperature.

The device main body 8 includes a power source unit 81 where the above-described regulator 12 and the heater resistor 15 are connected in parallel. With this power source unit 81, a driving voltage is applied to the oscillator circuit 11 via the regulator 12. The device main body 8 also includes a frequency measuring unit 82, a control unit 83, and an output adjustment unit 84. The frequency measuring unit 82 is connected to the oscillator circuit 11, and measures a frequency output from the oscillator circuit 11. A data signal on the frequency measured by the frequency measuring unit 82 is input into the control unit 83. The output adjustment unit 84 is connected to the temperature detector 52, adjusts a direction of a current and a supplied electricity supplied to the Peltier elements 63 and 64 based on the temperature of the crystal unit 4 detected by the temperature detector 52, and adjusts the temperature of the crystal unit 4. The operation of this output adjustment unit 84 is controlled by the control unit 83, and allows the temperature of the crystal unit 4 to be raised from a predetermined temperature at a predetermined speed as described below.

As described above, when the sensing sensor 1 is connected to the device main body 8 via the cooling mechanism 71, the frequency measuring unit 82 is connected to the oscillator circuit 11. The sensing sensor 1 switches the excitation electrodes to be connected to the oscillator circuit 11 between the reaction electrodes side (first excitation electrodes 41 and 43) and the reference electrodes side (second excitation electrodes 42 and 44) by switching the switches 13 and 14. This switching causes the frequency measuring unit 82 to measure each of a first oscillation frequency F1 on the reaction electrodes side and a second oscillation frequency F2 on the reference electrodes side. Then, when the gas including the substance to be sensed is supplied toward the sensing sensor 1, the substance to be sensed is attached to the first excitation electrode 41, and thus the first oscillation frequency F1 changes depending on an amount of the substance to be sensed.

Additionally, the above-described control unit 83 can display a graph indicating change with time on, for example, each of the first oscillation frequency F1, the second oscillation frequency F2, and the difference between F1 and F2, on a display unit (illustration omitted) disposed in the device main body 8. That is, in order to allow a user of the device to detect the substance to be sensed, respective time-series data on F1, F2, and F1-F2 is displayed.

Next, the operation of the sensing sensor 1 will be described. First, connecting the connector 27 of the sensing sensor 1 to the depressed portion 72 of the cooling mechanism 71 causes the sensing sensor 1 to be connected to the device main body 8 to form the sensing device. Then, the cooling mechanism 71 is operated to cool the base 2. Meanwhile, the upper surfaces of the Peltier elements 63 and 64 each become the cooling surface to decrease the temperatures of the Peltier elements 63 and 64, and the crystal unit 4 is cooled. At this time, the heat radiation surface (lower surface) of the Peltier element 63 on the upper stage side is cooled by the cooling surface (upper surface) of the Peltier element 64 on the lower stage side. This increases heat radiation efficiency from the Peltier element 63.

Figure 6:
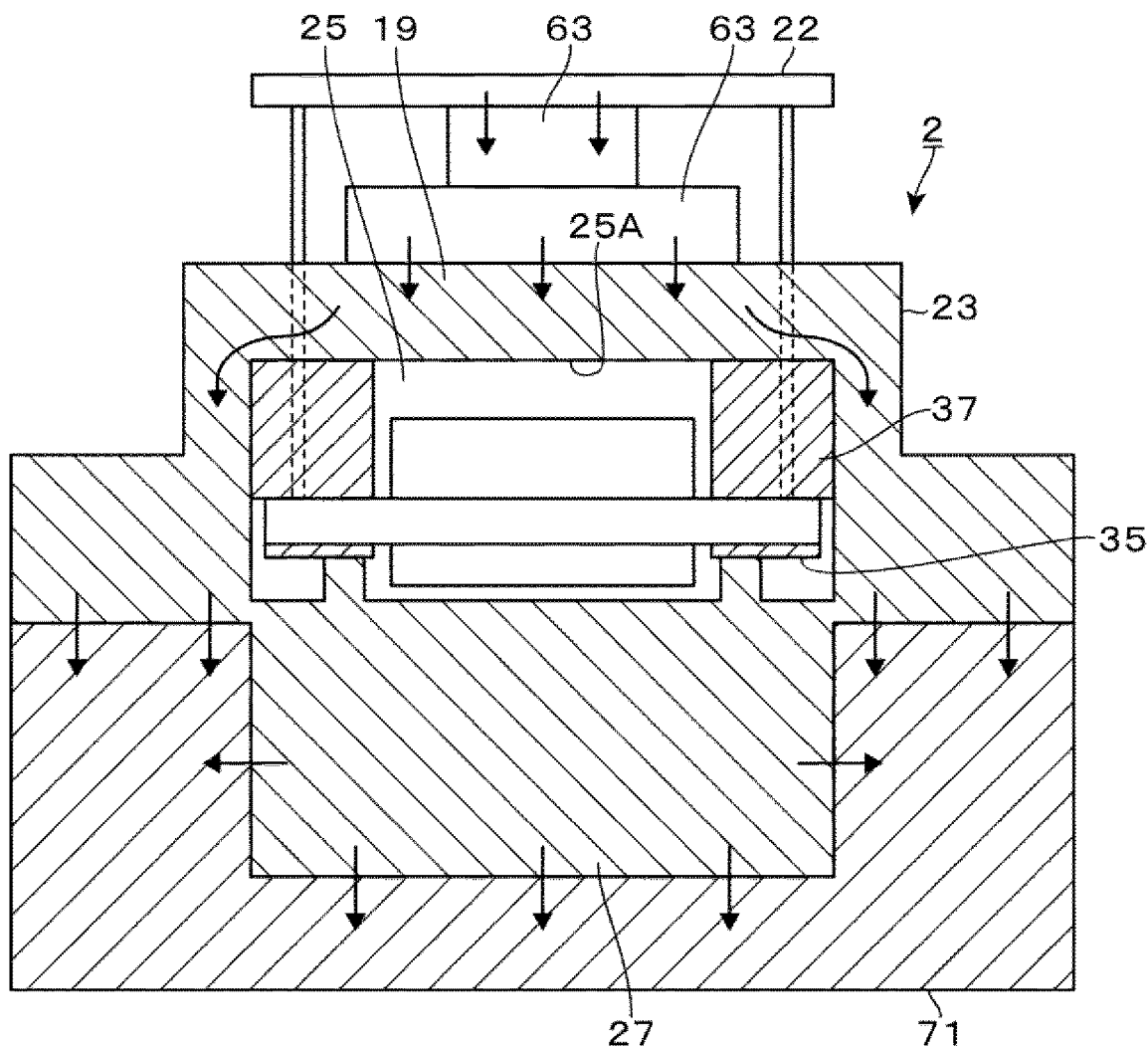
FIG. 6 is a schematic diagram illustrating movement of heat in the sensing sensor.

FIG. 6 schematically illustrates directions of the heat to transfer in the sensing sensor 1 when the crystal unit 4 is cooled as described above, using arrows. As described above, while the temperature of the cooling surface of the Peltier element 63 on the upper stage side decreases, the temperature of the heat radiation surface (lower surface) of the Peltier element 64 increases, and the heat is transferred from this Peltier element 64 to the protrusion portion 23 of the base 2. As described above, this heat is efficiently transferred to a lower portion of the base 2 and removed. That is, the heat is removed from the Peltier elements 63 and 64 with high heat radiation efficiency, and this suppresses radiating this heat to a peripheral area of the crystal unit 4. The efficient heat transfer to the base 2 in this way and the cooling by the Peltier element 64 on the lower stage side as described above make the temperature of the cooling surface of the Peltier element 63 on the upper stage side considerably low and also make the temperature of the crystal unit 4 considerably low.

Additionally, when the heat radiation to the base 2 is performed in this manner, the spacers 35 and the guiding members 37 as the heat insulating portions are interposed between the circuit board 3 and the wall portions of the housing space 25 of the base 2. This suppresses transferring the heat of the base 2 to the circuit board 3. Accordingly, the temperature rise of the circuit board 3 is suppressed. Then, once the temperature of the crystal unit 4 becomes −80° C. as a set temperature, the gas to be a sensing object is supplied toward the opening 61 of the sensing sensor 1. This gas is cooled by being brought into contact with the first excitation electrode 41 facing a bottom portion of the opening 61, and attached to the first excitation electrode 41.

Afterwards, the switches 13, 14 are switched at high speed, and the oscillation frequency F1 on the reaction electrodes side (first excitation electrodes 41 and 43) and the oscillation frequency F2 on the reference electrodes side (second excitation electrodes 42 and 44) are alternately obtained with time sharing by the control unit 83. The cooling with the Peltier elements 63 and 64 is weakened while the oscillation frequencies F1, F2 are obtained, and the temperature of the crystal unit 4 is raised at a speed of, for example, 1° C./minute. This temperature rise of the crystal unit 4 causes the substance to be sensed attached to the first excitation electrode 41 to be detached, which significantly changes the oscillation frequency F1. Meanwhile, the substance to be sensed is not attached to the second excitation electrode 42 on the reference electrode side, and thus the mass change due to such a detachment does not occur and the second oscillation frequency F2 hardly changes.

The temperature rise of the crystal unit 4 continues, an amount of the heat radiation from the Peltier elements 63 and 64 to the base 2 changes, and the temperature of the base 2 decreases. However, the heat insulating effect of the spacers 35 and the guiding members 37 suppresses change in the temperature of the circuit board 3. Accordingly, occurrence of change in the oscillation frequencies caused by a temperature characteristic of the oscillator circuit 11 is suppressed. Therefore, the obtained first oscillation frequency F1 and the difference between the first oscillation frequency F1 and the second oscillation frequency F2 correspond to the change in the mass of the above-described excitation electrodes with high accuracy. Once the temperature of the crystal unit 4 reaches the set temperature, for example 125° C., the temperature rise stops.

A user of the sensing device can read a timing in which the difference between the first oscillation frequency F1 and the second oscillation frequency F2 changes from the graph indicating the change with time of this difference, identify a temperature at which the change occurs based on the timing of this change, and further identify a type of the substance to be sensed based on the temperature. Additionally, based on the amount by which this difference between F1 and F2 changes, the mass of the substance to be sensed can be calculated. Note that, the device main body 8 may be configured to automatically perform these identification of the type and calculation of the mass of the substance to be sensed based on time-series data of the obtained difference between F1 and F2.

According to the above-described sensing sensor 1, the substrate 50 that supports the crystal unit 4 is supported on the upper portion side, and the circuit board 3 is disposed on the lower portion side. The circuit board 3 includes the oscillator circuit 11 in the housing space 25 provided in the base 2 that is cooled with the cooling mechanism 71. The Peltier elements 63 and 64 are interposed between the substrate 50 and the base 2. Then, the above-described housing space 25 is formed by covering the depressed portion 19 formed on the lower portion side of the base main body 21 with the lid portion 22 connected to the cooling mechanism 71. With such a configuration, increase in distance between the oscillator circuit 11 and the crystal unit 4 can be suppressed, and thus the oscillation margin can increase and the crystal unit 4 can be stably oscillated. Additionally, since the heat radiation from the Peltier elements 63 and 64 can be efficiently performed via the base 2, a changeable temperature range of the crystal unit 4 can be expanded by employing a crystal unit 4 having a low lower limit of the cooling temperature. Accordingly, various kinds of substance to be sensed can be detected.

Figure 7:
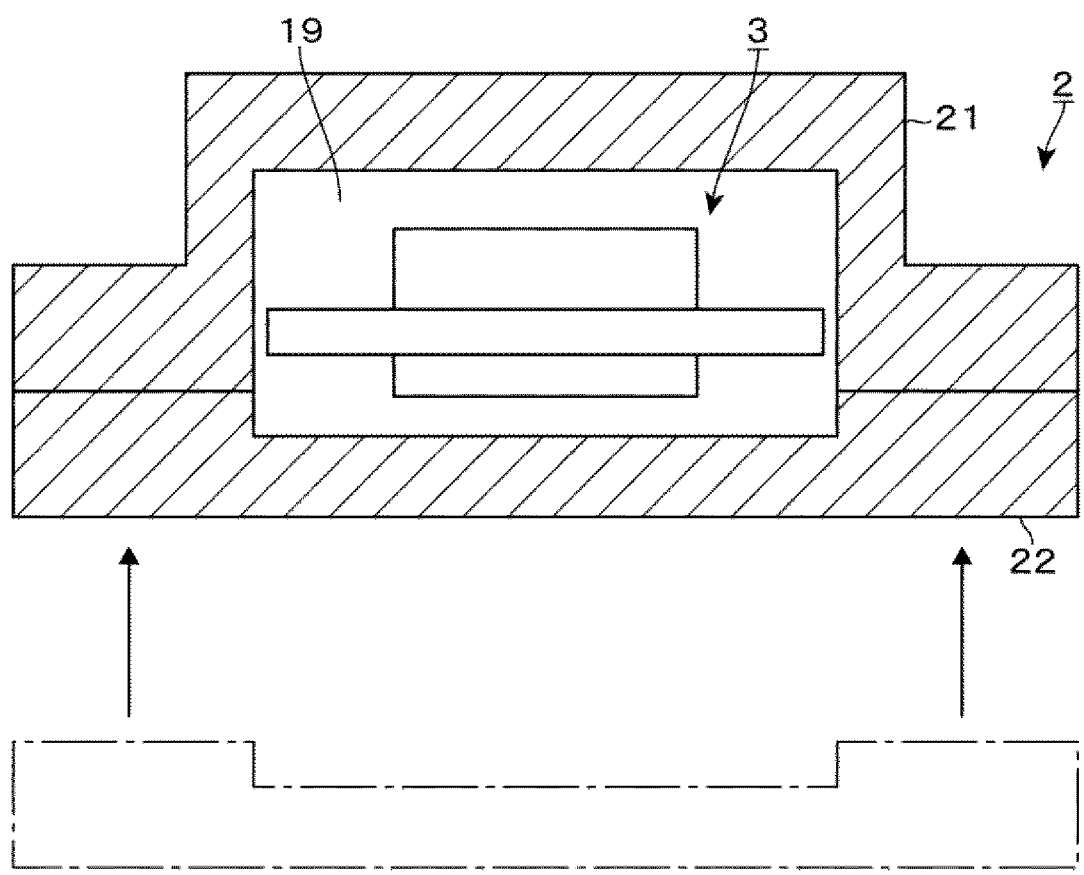
FIG. 7 is a schematic configuration diagram illustrating another exemplary configuration of the base in the sensing sensor.
Figure 8:
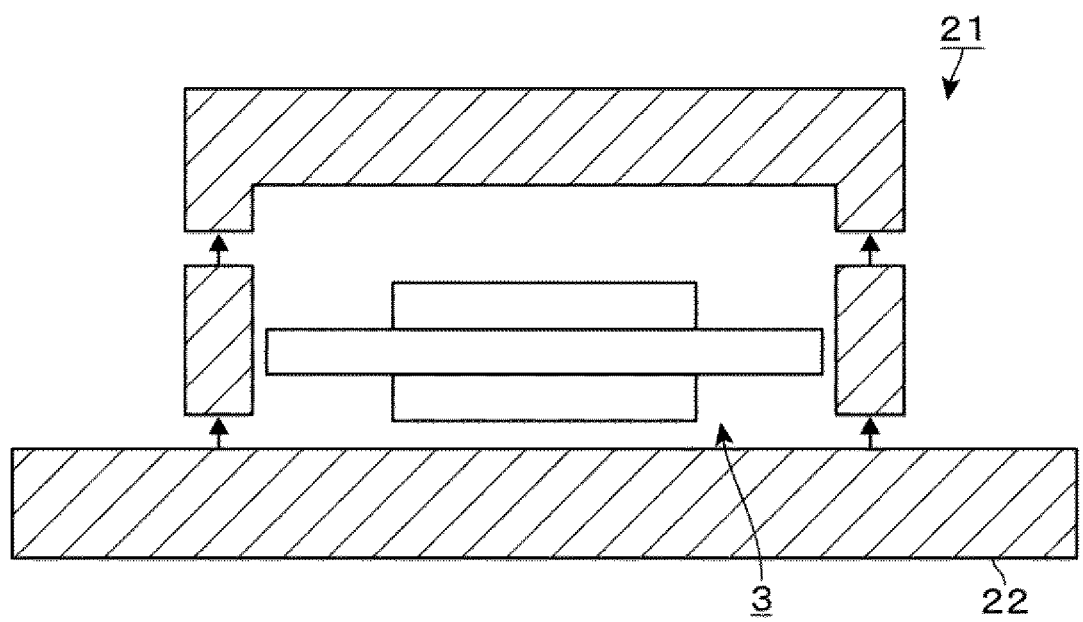
FIG. 8 is a schematic configuration diagram illustrating another exemplary configuration of the base in the sensing sensor.

Incidentally, it is only necessary that the base main body 21 that constitutes the base 2 has the depressed portion 19 formed to house the circuit board 3 while the depressed portion 19 is covered with the lid portion 22 to form the housing space 25. The lid portion 22 is not limited to have a structure in a flat plate shape to cover the depressed portion 19. For example, as illustrated in FIG. 7, the lid portion 22 may be configured to have a depressed portion, and the housing space 25 may be formed by bringing an opening edge portion of this depressed portion into contact with the opening edge portion of the depressed portion 19 of the base main body 21. Additionally, the base main body 21 may be configured to be divided. FIG. 8 illustrates an example in which the base main body 21 is divided into upper and lower portions. However, the base main body 21 is preferably integrally molded, which allows the heat transfer property to increase and the heat from the Peltier elements 63 and 64 to be efficiently removed with the cooling mechanism 71. Note that, the depressed portion 19 housing the circuit board 3 means that, for example, lower ends of the sidewalls of the depressed portion 19 are positioned downward with respect to the lower end of the circuit board 3. The lower end of the circuit board 3 is defined as a lower end of the integrated circuit 32 when the integrated circuit 32 is disposed on the lower surface as the above-described example. The lower end of the circuit board 3 is defined as the lower surface of the substrate main body 31 when the integrated circuit 32 is not disposed on the lower surface. Additionally, in the above-described example, the connector 27 is provided with the electrode to connect the sensing sensor 1 to the device main body 8, but the electrode is not necessarily disposed on such a position and may be disposed, for example, on the lower surface of the plate-shaped body 26 of the lid portion 22.

Note that, the embodiment disclosed this time is illustrative in every point and should be considered not to be restrictive. The above-described embodiment may be omitted, replaced, and changed in various manners without departing from accompanying claims and their spirits. For example, only one Peltier element may be disposed, and the Peltier elements may be disposed in multiple stages of three or more. Additionally, while the crystal unit in the above-described exemplary configuration is configured to be able to obtain the oscillation frequencies F1 and F2 with the reaction electrodes and the reference electrodes disposed to enhance the detection accuracy and perform the detection based on the oscillation frequencies F1 and F2, only the reaction electrodes may be disposed to obtain only the oscillation frequency F1 without having the reference electrodes, and the detection may be performed based only on the oscillation frequency F1.

With the disclosure, increase in the distance between the oscillator circuit and the piezoelectric resonator is suppressed, and thus the piezoelectric resonator can be stably oscillated. Furthermore, the heat radiation of the heat generated from the temperature changing unit is efficiently performed via the base, and the temperature of the piezoelectric resonator can be made a lower temperature. Thus, a changeable temperature range of the piezoelectric resonator can be expanded.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. A sensing sensor that senses a substance to be sensed based on a change of an oscillation frequency of the piezoelectric resonator, wherein the substance to be sensed which is a gas is attached to the piezoelectric resonator, and the substance to be sensed is detached by changing a temperature of the piezoelectric resonator, the sensing sensor comprising:
   an oscillator circuit, configured to oscillate the piezoelectric resonator;
   a base, including a base main body and a lid portion at one side of the base,
      wherein the base main body is provided with a depressed portion for housing the oscillator circuit, and the lid portion is for covering the depressed portion,
      the base is configured to support the piezoelectric resonator at another side of the base and take the oscillation frequency to an outside of the sensing sensor;
   a connection portion, being disposed at the one side of the base and connected to a cooling mechanism for cooling the base from the one side of the base; and
   a temperature changing unit, being interposed between the piezoelectric resonator and the base, so as to cool and heat the piezoelectric resonator and transfer a heat radiated for cooling the piezoelectric resonator from the another side of the base to the one side of the base;
   wherein the depressed portion is configured to house a circuit board including the oscillator circuit, and
   a heat insulating portion for insulating heat between the base and the circuit board is disposed at one side and at another side of the circuit board.

2. The sensing sensor according to claim 1, wherein the temperature changing unit includes a Peltier element.

3. The sensing sensor according to claim 2, wherein the Peltier element includes a first Peltier element and a second Peltier element that are laminated to one another.

4. The sensing sensor according to claim 1, wherein the temperature changing unit is configured to change the temperature of the piezoelectric resonator in a range from −80° C. to 125° C.

5. The sensing sensor according to claim 2, wherein the temperature changing unit is configured to change the temperature of the piezoelectric resonator in a range from −80° C. to 125° C.

6. The sensing sensor according to claim 3, wherein the temperature changing unit is configured to change the temperature of the piezoelectric resonator in a range from −80° C. to 125° C.

* * * * *